(12) United States Patent
Ecker et al.

(10) Patent No.: US 12,680,190 B2
(45) Date of Patent: Jul. 14, 2026

(54) SYSTEM FOR MANUFACTURING A HIGH-QUALITY SEMICONDUCTOR SINGLE CRYSTAL, AND METHOD OF MANUFACTURING SAME

(71) Applicant: SiCrystal GmbH, Nuremberg (DE)

(72) Inventors: Bernhard Ecker, Nuremberg (DE); Ralf Müller, Nuremberg (DE); Philipp Schuh, Nuremberg (DE); Matthias Stockmeier, Nuremberg (DE); Michael Vogel, Nuremberg (DE)

(73) Assignee: SICRYSTAL GMBH, Nuremberg (DE)

( * ) Notice: Subject to any disclaimer, the term of this patent is extended or adjusted under 35 U.S.C. 154(b) by 288 days.

(21) Appl. No.: 18/422,958

(22) Filed: Jan. 25, 2024

(65) Prior Publication Data

US 2024/0263346 A1 Aug. 8, 2024

(30) Foreign Application Priority Data

Feb. 8, 2023 (EP) .................................... 23155498

(51) Int. Cl.
*C30B 23/06* (2006.01)
*C30B 29/36* (2006.01)

(52) U.S. Cl.
CPC ............ *C30B 23/066* (2013.01); *C30B 29/36* (2013.01)

(58) Field of Classification Search
CPC ........ C30B 23/066; C30B 29/36; C30B 23/06
See application file for complete search history.

(56) References Cited

U.S. PATENT DOCUMENTS

| | | | | |
|---|---|---|---|---|
| 10,793,972 B1 * | 10/2020 | Xu | .......................... | C30B 29/36 |
| 2011/0300323 A1 * | 12/2011 | Straubinger | ............ | C30B 29/36 |
| | | | | 117/86 |

(Continued)

FOREIGN PATENT DOCUMENTS

| | | | | |
|---|---|---|---|---|
| CN | 109280976 B | * | 11/2021 | ............ C30B 23/00 |
| CN | 217786351 U | * | 11/2022 | |

(Continued)

OTHER PUBLICATIONS

Extended European Search Report of EP 23 15 5498.1, Jul. 5, 2023, 8 pages.

*Primary Examiner* — Robert M Kunemund
(74) *Attorney, Agent, or Firm* — Lewis Roca Rothgerber Christie LLP

(57) ABSTRACT

The present invention relates to systems and methods for growing bulk semiconductor single crystals, and more specifically, for growing a bulk semiconductor single crystals, such as silicon carbide, based on physical vapor transport. A sublimation system for growing at least one single crystal of a semiconductor material by means of a sublimation growing process comprises a crucible (102) having a longitudinal axis (120) and comprising a fixing means for at least one seed crystal (110) and at least one source material compartment (104) for containing a source material (108); a heating system being formed to generate an irregular temperature field around a circumference of the crucible (102) and/or along the longitudinal axis of the crucible (102); a thermal insulation unit (117) at least partly surrounding the crucible (102), wherein the thermal insulation unit (117) has a radially and/or axially asymmetric form to compensate the irregular temperature field.

15 Claims, 9 Drawing Sheets

(56)            References Cited

U.S. PATENT DOCUMENTS

2013/0171407  A1 *    7/2013  Franzoi  ................ G10K 11/172
                                                                         428/116
2020/0263318  A1      8/2020  Ecker et al.

FOREIGN PATENT DOCUMENTS

EP            3 699 328  A1      8/2020
WO      WO-2022194977  A1 *    9/2022    ........... C30B 23/025

* cited by examiner

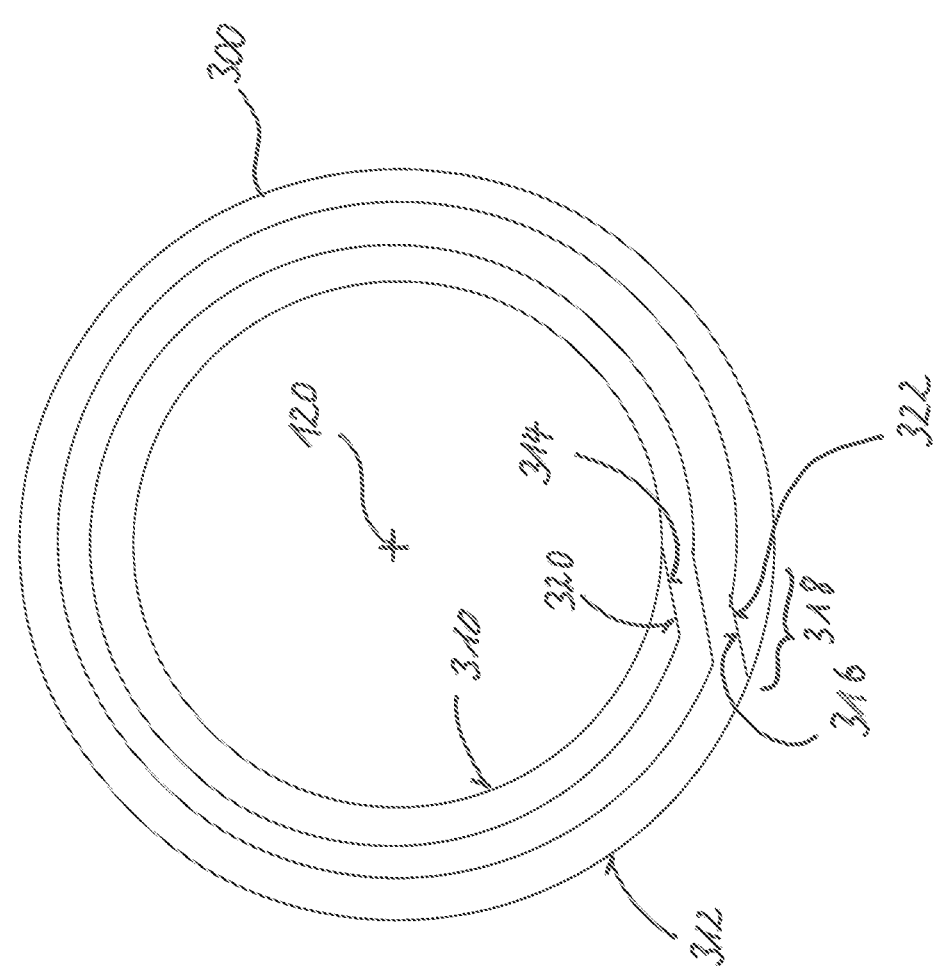
Fig. 5

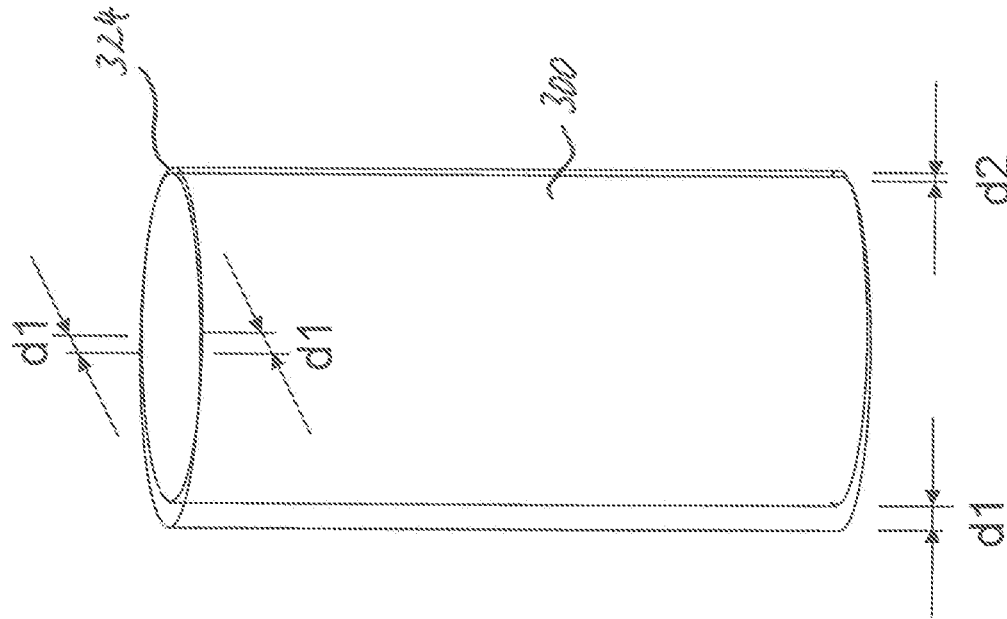

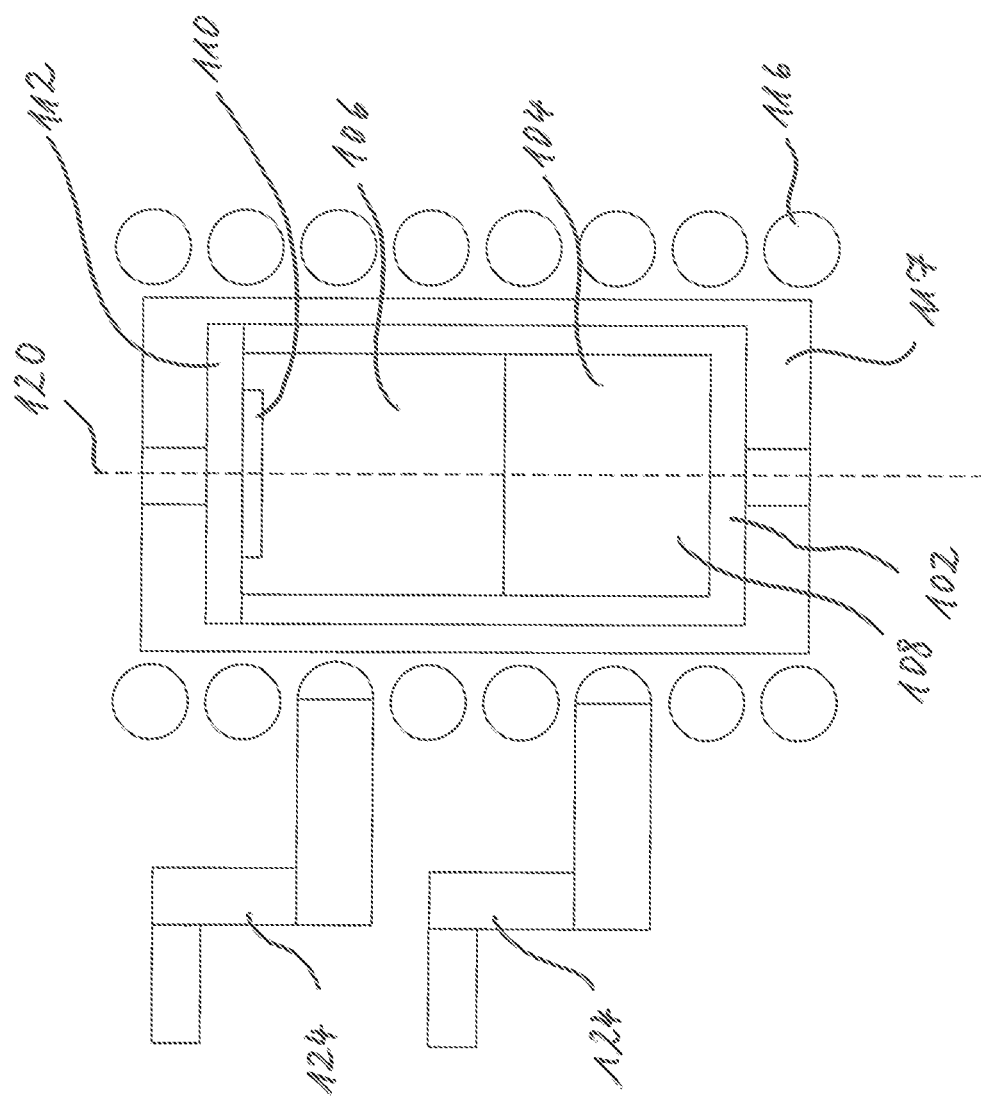
Fig. 8

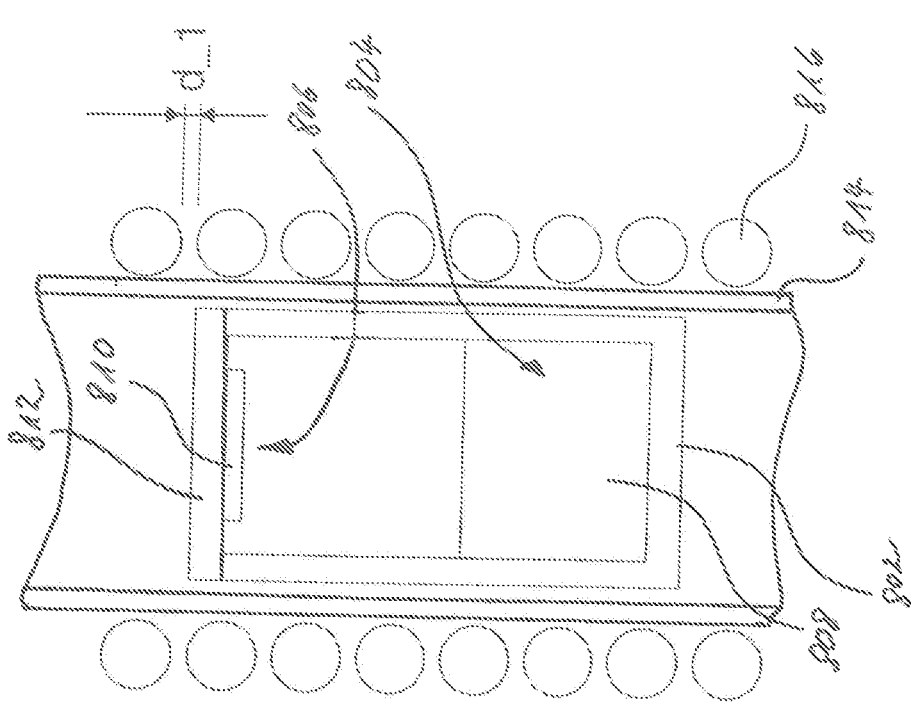
Fig. 11

SYSTEM FOR MANUFACTURING A HIGH-QUALITY SEMICONDUCTOR SINGLE CRYSTAL, AND METHOD OF MANUFACTURING SAME

CROSS-REFERENCE TO RELATED APPLICATION(S)

This application claims priority to European Patent Application No. 23 155 498.1, filed on Feb. 8, 2023, the entire content of which is incorporated herein by reference.

The present invention relates to systems and methods for growing bulk semiconductor single crystals, and more specifically, for growing a bulk semiconductor single crystals, such as silicon carbide, based on physical vapor transport.

Silicon carbide (SiC) substrates are generally used for electronic device fabrication. Using suitable source material, SiC single crystals are typically grown by a physical vapor deposition (PVT) process as shown for instance in U.S. Pat. No. 8,865,324 B2. The SiC substrates are then fabricated from the bulk single crystals using filament sawing or another suitable separation process, and the surface is then refined by multi-stage polishing steps. In the subsequent epitaxial processes, thin single crystalline layers (e.g. SiC, GaN) are deposited on the SiC substrates. The properties of these layers and the electronic components produced from them depend crucially on the quality of the SiC substrate.

In PVT crystal growth, resistance- or induction-heated crystal growth systems are usually used. The core of the sublimation system is the so-called reactor, in which the actual crystal growth takes place. A growth structure, which comprises an insulation, a crucible made from graphite and carbon material or a refractory metal or a combination thereof, the seed material and the source material, is placed inside the reactor. Heating is provided either by induction coils placed outside the reactor or by resistance heaters placed inside the reactor. Inside the crucible, an SiC source material is sublimated and deposited (i. e. desublimated) onto the SiC seed crystal. Thus, the SiC single crystal boule is grown. FIG. 11 illustrates such a conventional inductively heated PVT system 800.

The growth arrangement 800 comprises a growing crucible 802, which contains an SiC supply region 804 and a crystal growth region 806. Powdery SiC source material 808, which is poured as a pre-finished starting material before the beginning of the growth process into the SiC supply region 804 of the growing crucible 802, for example, is located in the SiC supply region 804. The source material 808 may also be densified or provided partly or completely as a solid material in order to enhance the density of the source material. A seed crystal 810 is provided on an inner wall opposing the SiC supply region 804 of the growing crucible 802, e. g. on its crucible lid 812, in the crystal growth region 806. The bulk SiC single crystal to be grown grows on the seed crystal 810 by deposition from an SiC growth gas phase forming in the crystal growth region 806. The growing bulk SiC single crystal and the seed crystal 810 may have approximately the same diameter.

The growing crucible 802 including the crucible lid 812 may be fabricated from an electrically and thermally conductive graphite crucible material. Around it is arranged a thermal insulation (not shown in the Figure), which may comprise, for example, a foam-like graphite insulation material, the porosity of which is, in particular, higher than that of the graphite crucible material.

The thermally insulated growing crucible 802 is placed inside a tubular container 814, which may be configured as a quartz glass tube and forms an autoclave or reactor. An inductive heating device in the form of a heating coil 816 is arranged around the container 814 to heat the growing crucible 802. The growing crucible 802 is heated by the heating coil 816 to growth temperatures of more than 2000° C., in particular to about 2200° C. The heating coil 816 inductively couples an electric current into an electrically conductive crucible wall (the so-called susceptor) of the growing crucible 802. This electric current flows substantially as a circulating current in the peripheral direction within the circular and hollow cylindrical crucible wall and in the process heat the growing crucible 802. The susceptor can be made from graphite, TaC, WC, Ta, W, or other refractory metals. The primary purpose of the susceptor is to provide a heat source for inside of the crucible 802. When the susceptor is heated with induction, the surface of the susceptor reaches a high temperature, and the temperature is then transferred to the inside of the crucible 802 through conduction and/or radiation.

As mentioned above, the induction coil 816 is mounted outside the glass tube 814 and is usually surrounded by a Faraday cage (not visible in the drawing) forming an electromagnetic shielding to shield the electromagnetic radiation. The induction coil 816 is wound with equidistant windings, each being distanced from the adjacent winding by a distance d_1.

Furthermore, in conventional resistively-heated PVT systems, the heating resistive elements are mounted inside the reactor. In case the reactor is made of metal, it can be cooled by water or air. Examples of resistively-heated PVT systems are described in published patent applications US 2016/0138185 A1 and US 2017/0321345 A1.

The temperature is measured by one or more pyrometers or by one or more thermocouples. The vacuum-sealed reactor can be evacuated by one or more vacuum pumps. Furthermore, the system can be supplied with inert or doping gases via one or more gas supply lines and the pressure in the system can be measured and controlled. All process parameters (pressure, temperature, gas flows etc.) can be set, controlled, and archived by a computerized system control. The sublimation system control unit communicates with all components involved (e. g. converter, pyrometer, vacuum control valve, mass flow controller (MFC), pressure gauges).

For the growth of SiC single crystals in the PVT process, a temperature profile as defined and homogeneous as possible is required. The deposition of the silicon and carbon atoms and compounds on the seed obeys this temperature field. Usually, a temperature field in the growth zone is chosen so that a convex crystal is formed, which has a higher length in the center than in its edge region. This is to avoid the ingrowth of edge defects that can occur due to the contact of the growing crystal with the reactor enclosing it.

For the growth of a high-quality crystal, a homogeneous coupling of the heat into the growth crucible is of enormous importance. By coupling the heat as homogeneously as possible, the crystal should also grow as homogeneously and symmetrically as possible. This should avoid different growth rates at the crystal periphery.

Different growth rates around the circumference at the crystal periphery lead to increased manifestations of edge defects. Thus, at positions with a lower growth rate (caused by a locally hotter temperature), increased material wear can occur on the adjacent reactor material, the material can dissolve and fall into the area planned as the usable crystal diameter and reduce the usable crystal diameter. The defect pattern that can be observed are carbon inclusions and/or carbon particles. Similarly, local temperature differences in the edge region can interrupt or disrupt the step flow necessary for the growth of polytypic 4H-SiC and give rise to polytype changes, whereby these undesirable foreign polytypes (e. g. 6H, 15R) can then spread from the edge region towards the crystal center. Thereby, the usable crystal diameter is also reduced.

Differing growth rates at the crystal periphery also cause disruptions in the crystal lattice and stresses in the crystal, which lead to the formation of dislocations.

All of these defects lead to reduced quality of grown single crystal boules and thus to reduced yield of single crystal SiC substrates fabricated from them, which may be suitable for electronic device fabrication.

Up to now, the influence of the growing system has been underestimated, which is becoming increasingly clear, especially with the continuously increasing crystal diameters. in conventional growing systems, attempts have been made to increase the crystal quality mainly by optimizing the insulation structure itself.

For instance, in EP 3 699 328 A1 a method for improving the quality of SiC single crystal by using a particularly homogeneous insulation is described. A multi-part design of insulation cylinders and corresponding alignment to each other, is intended to compensate for the intrinsic material inhomogeneities. However, the use of optimized insulation is not always sufficient to compensate for the disadvantageous design of the growth systems, especially with continuously increasing crystal diameters.

Furthermore, DE10 2009 004 751 B4 discloses a method for homogenizing the insulation properties by reducing local hotspots through the use of short carbon fibers. The use of these short carbon fibers is intended to reduce the coupling of the induction field into the insulation material, thereby reducing the generation of ring currents and local hotspots in the insulation material. However, the use of such optimized insulation is not sufficient to compensate for the disadvantageous design of the growth systems, especially with continuously increasing crystal diameters.

Even the highest demands on the design of growth equipment to produce a homogeneous and ideally radially symmetrical temperature field still regularly lead to crystals that have the edge defects described above. This has been attributed by the inventors to the fact that despite fabricating all the necessary construction elements of materials such as plastic or hard paper or similar composite and construction materials, the construction elements still influence the induction field and/or the temperature transmission from a resistive heater.

The present invention has been made in view of the shortcomings and disadvantages of the prior art, and an object thereof is to provide a system for growing single crystals of a semiconductor material by physical vapor transport (PVT) and a method of manufacturing same with improved single crystal quality and in a cost effective manner.

This object is solved by the subject matter of the independent claims. Advantageous embodiments of the present invention are subject matter of the dependent claims.

The present invention is based on the idea that despite the use of a growth system that produces an inhomogeneous temperature field, it is possible to grow high quality, crystals that are as free as possible from edge defects, if a special isolation design is used.

In particular, a sublimation system for growing at least one single crystal of a semiconductor material by means of a sublimation growing process comprises a crucible. The crucible has a longitudinal axis and comprises a fixing means for at least one seed crystal and further comprises at least one source material compartment for containing a source material. The sublimation system further comprises a heating system being formed to generate an irregular temperature field around a circumference of the crucible and/or along the longitudinal axis of the crucible. A thermal insulation unit is at least partly surrounding the crucible, and has a radially and/or axially asymmetric form to compensate the irregular temperature field. This targeted introduction of an asymmetric insulation into an asymmetric growth system results, in combination, in a homogeneous temperature field in the growth chamber. As a result, a homogeneous and edge defect-free SiC single crystal can be grown.

Inhomogeneities, for example in the density, porosity, thermal conductivity, and/or electrical conductivity of the insulation material can lead to local differences in the quality of the heat insulation and dissipation. Therefore, these inhomogeneities influence the temperature distribution within the growth crucible. According to the present disclosure, the intentional insertion of such inhomogeneities through manipulation of the insulation structure is achieved via the introduction of steps, cuts, or by local milling, edging, grooving, or densification via cramping or stitching or the like. The inhomogeneities in the insulation material may therefore be used to counteract the inhomogeneities caused by asymmetries in the heating system.

In particular, a thickened portion or an overlap of the thermal insulation unit reduce the heat loss and may therefore counteract "cold spots" in the temperature field generated by the heating system. On the other hand, gaps or thinned regions of the thermal insulation unit enhance the heat loss and thus may counterbalance "hot spots" in the temperature field generated by the heating system. A space-resolved 3D measurement of the temperature field and/or the electro-magnetic field generated by the heating system in operation can be used to obtain the information about the actual asymmetries in the heating system.

For instance, the heating system comprises an induction coil operable to generate an electro-magnetic field and/or a resistive heating coil, at least partly surrounding the crucible. In the case of an inductive heating, the coil is placed outside the reactor, in case of a resistive heating, the coils are placed inside the reactor. Advantages of the induction heating include the strict control over the highly critical temperature in the growth chamber, the non-contact method of heating the crucible, and the ability to perform within varying atmospheres. A general advantage of resistance heating systems over other types of heating systems is the greater electrical efficiency and less complex control.

According to an advantageous example of the present disclosure, the thermal insulation unit comprises a needled carbon felt and/or densified carbon short fibers. Carbon felts are flexible insulation materials for high temperature applications in inert or vacuum atmosphere and comprise carbon fibers which are stabilized by a needling process. For instance, the base material for the production of carbon and graphite soft felt is felts made of needled cellulose fibers. These are processed into carbon soft felts by thermal treatment at 800-1000° C. If these felts are treated at even higher temperatures >2,000° C., the carbon fibers increasingly take on a graphite-like structure, the so-called "graphite soft felts", without a real graphite structure being given.

Carbon short fibers in the sense of the present disclosure are intended to signify an insulation material with carbon fibers having a fiber length in the range between 1 mm and 10 mm, and a fiber diameter in the range between 0.1 mm and 1 mm, as for instance disclosed in DE 10 2009 004 751 B4.

In order to facilitate the manufacturing and assembly of the thermal insulation unit, the thermal insulation unit comprises a bendable sheet of carbon material, which is wrapped around the crucible, and comprises a stitching, at least one cramp, and/or an overlap region.

By means of asymmetries of the thermal isolation, technically unavoidable asymmetries in the growth system, in particular in the heating system, can be countervailed.

The asymmetry of the temperature field generated by the heating system can occur in various manners. In case of an inductive heating, the heating system may for instance comprise a metallic strut member. In such a case there is a particularly well-defined location of the asymmetry, so that the arrangement of the counter-acting asymmetry in the thermal insulation unit can be achieved particularly easy.

An alternative way of an inhomogeneous heating might occur when using a heating system, in which the coil has a deformed cross-section in at least one of its windings, and/or in which the coil has at least one winding, which is arranged to have a different distance from its neighboring windings.

Further, the coil may also comprise at least one electrical contact, which is arranged at an axial position adjacent to the crucible.

A particularly stable geometry can be achieved, if the thermal insulation unit has a cylindrical shape with a varying wall thickness around its circumference.

Another possibility of introducing the desired asymmetry into the thermal insulation unit can be realized if the thermal insulation unit comprises one or more slots forming at least one gap or trench.

Furthermore, the thermal insulation unit may be formed by a plurality of separate parts which are assembled to have junctions extending in a radial and/or an axial direction.

In the case of using a planar sheet is the starting material for the thermal insulation unit, the sheet of insulating material is arranged around the crucible forming an abutting joint, a slanted abutting joint, and/or an overlapping joint.

The present disclosure further relates to a method of growing at least one single crystal of a semiconductor material by means of a sublimation growing process, the method comprising:

providing a crucible having a longitudinal axis, fixing at least one seed crystal at a fixing means of the crucible, and filling a source material into at least one source material compartment;

generating, by means of a heating system, an irregular temperature field around a circumference of the crucible and/or along the longitudinal axis of the crucible;

wherein a thermal insulation unit is provided which is at least partly surrounding the crucible, and which has a radially and/or axially asymmetric form to compensate the irregular temperature field.

Advantageously, the temperature field acting on the growing single crystal causes a growth rate measured around a defined circumference of the single crystal to differ for any two points along the circumference by at least 0.1 µm/h and not more than 10 µm/h, preferably by 0.7 µm/h. The growth rate is measured after the growth process is completed by determining the final geometry using a dial gauge or the like and with the knowledge of the applied growth time.

Advantageously, the temperature field acting on the growing single crystal causes the finally grown single crystal to have a distribution of length values between a back surface of the single crystal and a top surface of the single crystal, measured along a defined circumference of the single crystal, which differ from a mean value by not more than 10%, preferably by not more than 5%.

When measuring the height of the finally grown single crystal, the defined circumference is either an outer circumference of the finally grown single crystal, or the defined circumference is a radial distance from the center of the finally grown single crystal, which can correspond to a diameter of a wafer produced from the finally grown single crystal.

The accompanying drawings are incorporated into the specification and form a part of the specification to illustrate several embodiments of the present invention. These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements, and wherein:

FIG. 5 is a schematic top view of a thermal insulation unit according to a further example;

FIG. 6 is a schematic side view of a thermal insulation unit according to a further example;

FIG. 8 is a schematic sectional side view of a sublimation system according to a further example;

FIG. 11 is a schematic sectional side view of a known sublimation system.

The present invention will now be explained in more detail with reference to the Figures and firstly referring to FIG. 1.

Figure 1:
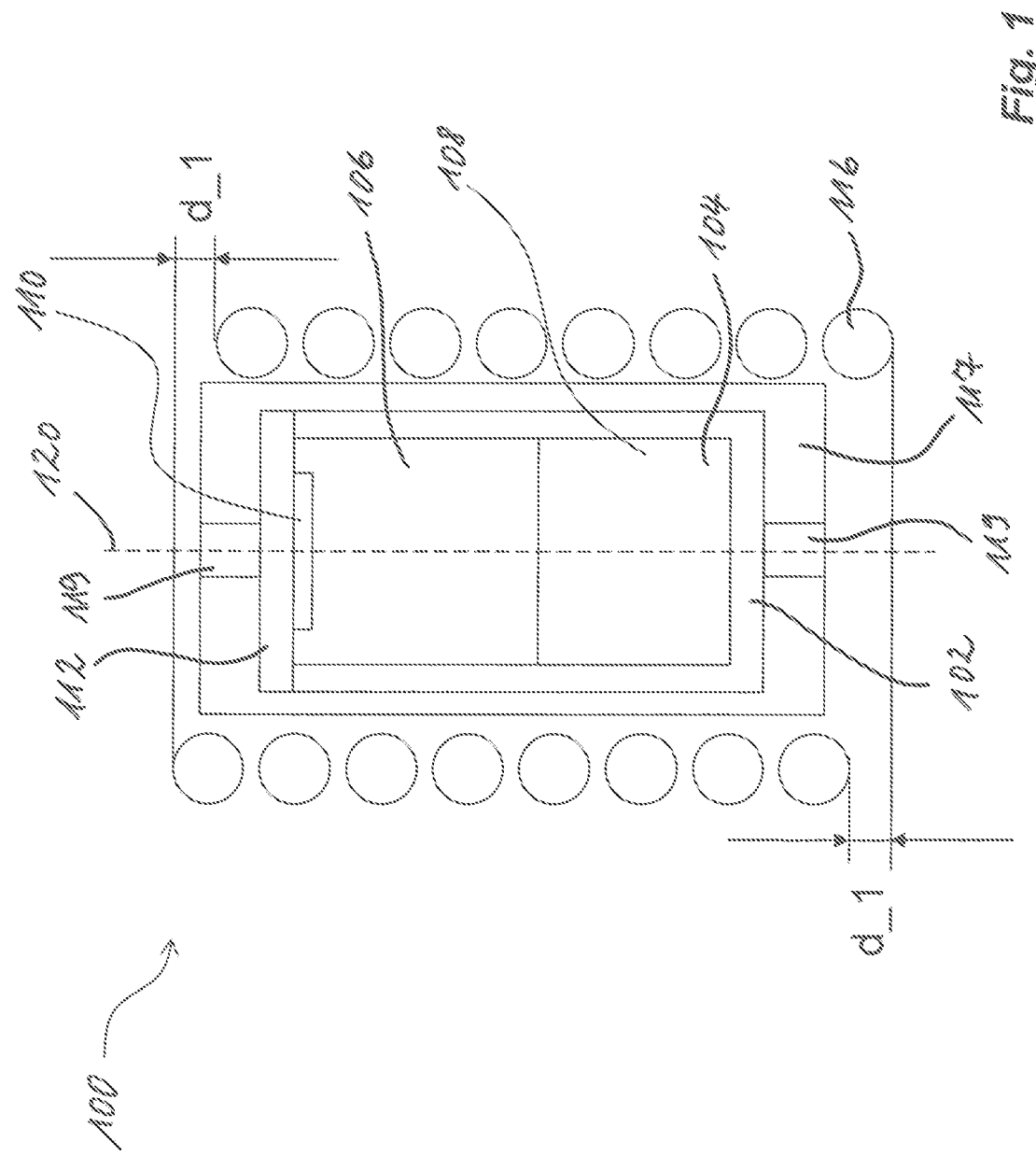
FIG. 1 is a schematic sectional side view of a sublimation system according to a first example.

FIG. 1 shows a sublimation system 100 according to a first example of the present disclosure. It should be noted that the term sublimation system is intended to cover any system for growing at least one single crystal of a semiconductor material by means of a sublimation growing process. Preferably, the term refers to a physical vapor transport (PVT) system for growing silicon carbide (SiC) volume single crystals as described with reference to FIG. 11.

The sublimation system 100 comprises a growing crucible 102, which contains a source material compartment, in particular an SiC supply region 104 and a crystal growth region 106. SiC source material 108, which may be powdery and is poured as a pre-finished starting material before the beginning of the growth process into the SiC supply region 104 of the growing crucible 102, for example, is located in the SiC supply region 104. The source material 108 may also be densified or provided partly or completely as a solid material in order to enhance the density of the source material 108.

A seed crystal 110 is provided on an inner wall opposing the SiC supply region 104 of the growing crucible 102, for instance on its crucible lid 112, in the crystal growth region 106. The bulk SiC single crystal to be grown grows on the seed crystal 110 by deposition from an SiC growth gas phase forming in the crystal growth region 106. The growing bulk SiC single crystal and the seed crystal 110 may have approximately the same diameter. The growing bulk SiC single crystal may have a larger diameter than the seed crystal 110, if the diameter of the crystal channel is larger than the seed crystal's diameter. However, the usable low-defect diameter of the growing bulk SiC single crystal has normally a size corresponding to the seed crystal's diameter.

The growing crucible 102 including the crucible lid 112 may be fabricated from an electrically and thermally conductive graphite crucible material. Around it is arranged a thermal insulation unit 117, which may comprise, for example, a foam-like or felt-like graphite insulation material, the porosity of which is, in particular, higher than that of the graphite crucible material. A transparent window 119 is provided at one or both of the axial end regions of the thermal insulation unit 117. These transparent windows 119 can be used to measure the temperature of the crucible 102.

In case of an inductive heating, the thermally insulated growing crucible 102 is placed inside a tubular container (not shown in FIG. 1), which may be configured as a quartz glass tube and forms an autoclave or reactor. An inductive heating device in the form of a heating coil 116 is arranged around the container to heat the growing crucible 102. The heating coil 116 generates the required temperature field by inductively coupling an electric current into an electrically conductive crucible wall (the susceptor) of the growing crucible 102. This electric current flows substantially as a circulating current in the peripheral direction within the circular and hollow cylindrical crucible wall and in the process heats the growing crucible 102. The susceptor can be made from graphite, TaC, WC, Ta, W, or other refractory metals, and may either be an integral part of the crucible 102 or may be a separate part close to the crucible wall. The primary purpose of the susceptor is to provide a heat source for inside of the crucible 102. When the susceptor is heated with induction, the surface of the susceptor reaches a high temperature, and the temperature is then transferred to the inside of the crucible 102 through conduction and/or radiation.

As mentioned above, the coil 116 is mounted outside the glass tube in case of an inductive heating and is usually surrounded by a Faraday cage (not visible in FIG. 1) to shield the electromagnetic radiation. In case of a resistive heating, the coil 116 is mounted within the reactor and also within the thermal insulation, thus being in close contact to the crucible 102. The principles of the present disclosure are applicable to both heating techniques. Thus, the coil 116 will more generally be referred to as a heating means and encompasses inductive as well as resistive heating (or a combination thereof) in the following. Furthermore, it should be noted that in the present disclosure the coil windings are depicted as having a rounded, specifically a circular or elliptic cross-section. However, the coil windings may have any other suitable cross-section, such as quadratic or rectangular, as well.

According to the example shown in FIG. 1, all the windings of the coil 116 are shifted along the central axis 120 to have an increased slope. Thus, two opposing regions of each winding are axially offset for instance by a distance d_1. The result is a rotationally asymmetric temperature field that would be generated by the heating means in operation.

However, according to the principles of the present disclosure, the thermal insulation unit 117 has a shape and structure which introduce an asymmetry counteracting the asymmetric temperature field by the asymmetry of the heating means 116.

FIGS. 2 to 6 illustrate various examples of how the thermal insulation unit 117 may be structured in order to provide the asymmetry of the insulation that compensates the impact of the asymmetry of the heating unit 116 and in the end leads to a symmetric temperature field in the crystal growth region 106 during the growth of the single crystal boule.

For instance, the thermal insulating unit 117 may have a body 300 formed from a sheet of carbon felt, which is wrapped around the crucible 102 (see FIG. 1). At a joint 302 of the two ends of the sheet, a stitching 304 is provided to stabilize the body 300. The joint 302 with the stitching 304 constitutes a discontinuity which extends in a longitudinal direction along the central axis 120 (see FIG. 1). This discontinuity has to be positioned at a radial position that causes the discontinuity of the thermal insulation unit 117 to compensate the asymmetry of the heating means 116. Of course, also more than one joint 302 with a respective stitching 304 may be provided in order to achieve a highly homogenous temperature field acting on the growing single crystal.

The stitching 304 is formed with threads made from carbon fibers. Other suitable electrically non-conductive, highly heat resistive materials may also be used.

Figures 2, 3, 4:
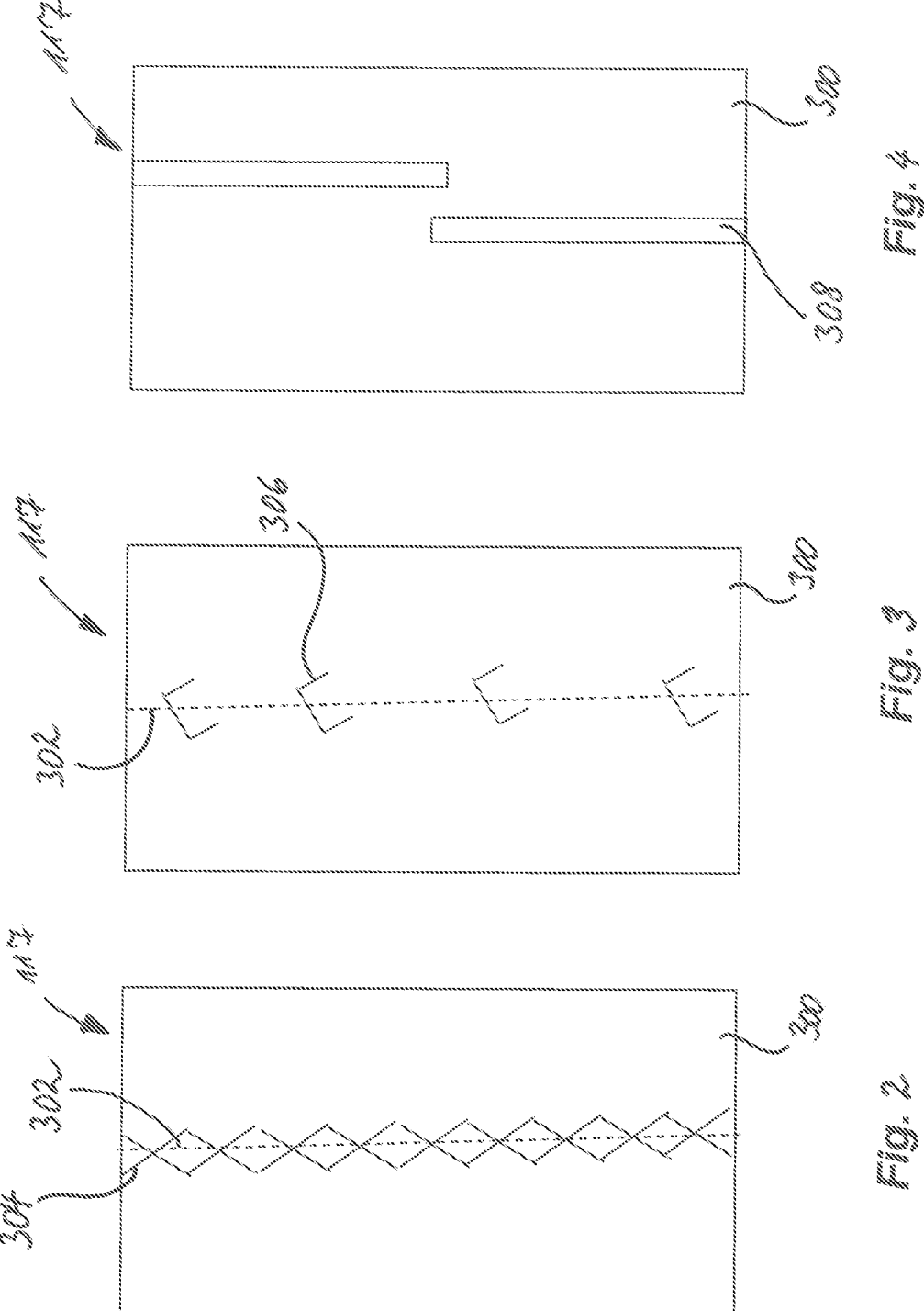
FIG. 2 is a schematic side view of a thermal insulation unit according to a first example.
FIG. 3 is a schematic side view of a thermal insulation unit according to a further example.
FIG. 4 is a schematic side view of a thermal insulation unit according to a further example.

Instead of a stitching 102 (or in addition thereto), the joint 302 may also be stabilized by one or more cramps 306. This example is shown in FIG. 3. Again, the joint 302 with the cramps 306 constitutes a discontinuity which extends in a longitudinal direction along the central axis 120 (see FIG. 1). This discontinuity has to be positioned at a radial position that causes the discontinuity of the thermal insulation unit 117 to compensate the asymmetry of the heating means 116. Of course, also more than one joint 302 with respective one or more cramps 306 may be provided in order to achieve a highly homogenous temperature field acting on the growing single crystal.

The cramps 306 are for instance manufactures from impregnated and stiffened threads made from carbon fibers. Other suitable electrically non-conductive, highly heat resistive materials may also be used.

Another example of providing a discontinuity in the thermal insulation unit 117 is shown in FIG. 4. According to this advantageous example, the body 300 of the thermal insulation unit 117 is provided with one or more slots 308. The slots 308 may be formed as either extending radially through the complete wall thickness of the body 300, thus forming a gap. Alternatively, the one or more slots 308 may also extend radially only through a part of the wall thickness of the body 300, thus forming trenches in the material of the body 300. The slots 308 constitute a discontinuity which extends in a longitudinal direction along the central axis 120. This discontinuity has to be positioned at a radial position that causes the discontinuity of the thermal insulation unit 117 to compensate the asymmetry of the heating means 116.

It should be noted, that the different examples of introducing a discontinuity into the body 300 of the thermal insulation unit 117 may of course be combined with each other as desired and necessary for achieving a highly homogenous temperature field acting on the growing single crystal.

A further example of a thermal insulation unit 117 is shown in a top view in FIG. 5.

According to this example, the body 300 of the thermal insulation unit 117 is formed by a sheet of thermally insulating material, such as for example a needled carbon felt, which is wound around the central axis 120 in a plurality of turns. In order to present a smooth inner surface 310 and a smooth outer surface 312, the end regions of the sheet have bevels 314, 316 extending along the central axis 120. In case the body 300 is formed by only a single layer of thermally insulating material (not shown in the Figure), the bevels 314 and 316 touch directly and close the thermal insulation unit 117 around the central axis 120. IN the shown example, the body has a triple layer configuration. The sheet forming the body 300 is spirally wound around the central axis 120 so as to form a circular straight cylinder. In the joint region 318, the inner layers have kinked regions that provide slanted supporting surfaces 320, 322 for the bevels 314, 316 of the end regions.

The joint region 318 of the body 300 provides a discontinuity which extends in a longitudinal direction along the central axis 120. This discontinuity has to be positioned at a radial position that causes the discontinuity of the thermal insulation unit 117 to compensate the asymmetry of the heating means 116.

FIG. 6 illustrates schematically a further example of how the thermal insulation unit 117 can be provided with a discontinuity that in operation of the heating means counteracts an asymmetry of the temperature field generated by the heating means. As shown in FIG. 6, the body 300 of the thermal insulation unit 117 has an essentially cylindrical shape with a wall thickness that varies in a radial direction around the circumference of the body 300. For instance, in a region covering more than 10° and less than 180° of the circumference, preferably more than 10° and less than 90° of the circumference, the wall 324 of the body 300 has reduced thickness d2 compared to the rest of the circumference, where the wall 324 has a thickness d1. Of course, the discontinuity may also be created by providing a region with a thickness d2 that is larger than the thickness d1 at the rest of the circumference of the body 300. The discontinuity can be abrupt or evolve gradually.

Thus, a discontinuity is generated which extends in a longitudinal direction along the central axis 120. This discontinuity has to be positioned at a radial position that causes the discontinuity of the thermal insulation unit 117 to compensate the asymmetry of the heating means 116.

Figure 7:
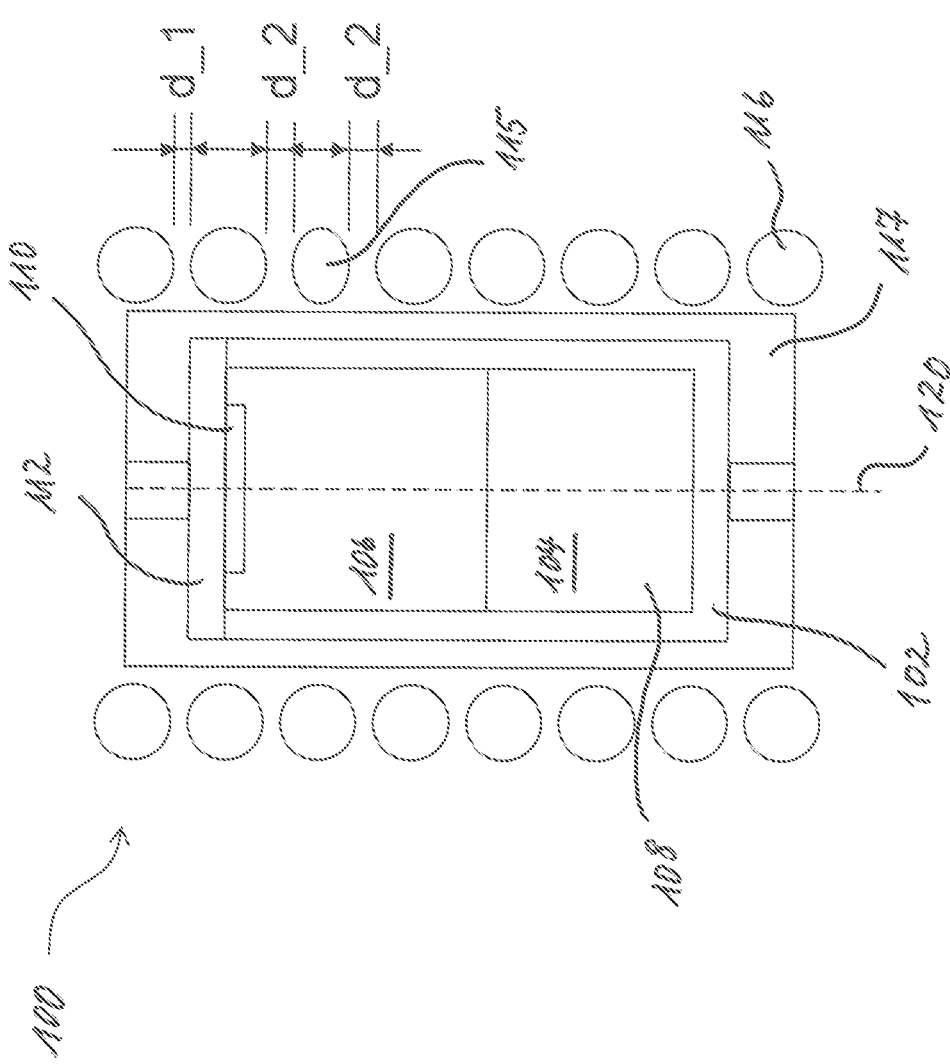
FIG. 7 is a schematic sectional side view of a sublimation system according to a further example.

Returning now to the various possibilities of providing a heating means 116 which as such and without further counter measures produces an asymmetric temperature field acting on the growing single crystal, FIG. 7 shows a sublimation system 100 according to a further example of the present disclosure. It should be noted that the principles are essentially the same as explained with reference to FIG. 1.

In particular, the sublimation system 100 comprises a growing crucible 102, which contains a source material compartment, in particular an SiC supply region 104 and a crystal growth region 106. The SiC source material 108, which is poured as a pre-finished starting material before the beginning of the growth process into the SiC supply region 104 of the growing crucible 102, for example, is located in the SiC supply region 104. A seed crystal 110 is provided on an inner wall opposing the SiC supply region 104 of the growing crucible 102, for instance on its crucible lid 112, in the crystal growth region 106. The bulk SiC single crystal to be grown grows on the seed crystal 110 by deposition from an SiC growth gas phase forming in the crystal growth region 106.

The growing crucible 102 including the crucible lid 112 may be fabricated from an electrically and thermally conductive graphite crucible material. Around it is arranged the thermal insulation unit 117, which may for instance be fabricated in line with the principles explained above referring to any of the FIGS. 2 to 6.

In case of an inductive heating, the thermally insulated growing crucible 102 is placed inside a tubular container (not shown in FIG. 1), which may be configured as a quartz glass tube and forms an autoclave or reactor. An inductive heating device in the form of a heating coil 116 is arranged around the container to heat the growing crucible 102. The heating coil 116 generates the required temperature field by inductively coupling an electric current into an electrically conductive crucible wall (the susceptor) of the growing crucible 102. This electric current flows substantially as a circulating current in the peripheral direction within the circular and hollow cylindrical crucible wall and in the process heat the growing crucible 102. The susceptor can be made from graphite, TaC, WC, Ta, W, or other refractory metals, and may either be an integral part of the crucible 102 or may be a separate part close to the crucible wall. The primary purpose of the susceptor is to provide a heat source for inside of the crucible 102. When the susceptor is heated with induction, the surface of the susceptor reaches a high temperature, and the temperature is then transferred to the inside of the crucible 102 through conduction and/or radiation.

As mentioned above, the coil 116 is mounted outside the glass tube in case of an inductive heating and is usually surrounded by a Faraday cage (not visible in FIG. 1) to shield the electromagnetic radiation. In case of a resistive heating, the coil 116 is mounted within the reactor and also within the thermal insulation, thus being in close contact to the crucible 102. The principles of the present disclosure are applicable to both heating techniques.

As shown in FIG. 7, the coil 116 has at least one deformed region 115, in which the cross-section of the coil 116 deviates from the circular cross-section of the remaining windings. In FIG. 7, this deviation is depicted as a compression leading to an elliptical cross-section in the deformed region 115. Of course, also other cross-sectional irregularities may be present at the coil 116. In the deformed region 115, the distance between the deformed winding to the adjacent windings is enlarged to a distance $d\_2$ compared to the regular distance $d\_1$ between the undeformed remaining windings. The position and extent of these irregularities may be found upon inspection of the heating system, e. g. when performed crystal growth cycles produced unsatisfactory single crystal boules. The asymmetric thermal insulation according to the present disclosure may then be used to counteract the heating system irregularities.

In operation, the constructional asymmetry due to this deformed region 115, which may cover e. g. 10° to 90° of the circumference, preferably 10° to 45°, causes an irregularity in the temperature field. This irregularity extends in a radial direction (around the circumference of the crucible) as well as in an axial direction (along the center axis 120).

The result is a rotationally asymmetric temperature field that would be generated by the heating means in operation.

However, according to the principles of the present disclosure, the thermal insulation unit 117 has a shape and structure which introduce an asymmetry counteracting the asymmetric temperature field by the asymmetry of the heating means 116. Thus, the temperature field to which the growing single crystal is subjected is homogenous and symmetric, and it is possible to grow high quality crystals that are as free as possible from edge defects.

Furthermore, a constructional asymmetry may also be introduced into the sublimation system 100 when the electrical contacts 124 of the heating coil 116 have to be arranged in an area surrounding the crucible 102. This example is shown in FIG. 4. At least one of the current feeding electrical contacts 124 is located not at a peripheral end of the heating coil 116, but is arranged in an axial region where they constitute a structural asymmetry close to the crucible 102 and in particular, close to the crystal growth region 106. Thus, in operation the heating coil 116 generates a non-uniform temperature field, unless it is counteracted by the asymmetry of the thermal insulation unit 117. As explained above, according to the principles of the present disclosure, the thermal insulation unit 117 has a shape and structure which introduce an asymmetry counteracting the asymmetric temperature field by the asymmetry of the heating means 116. Thus, the temperature field to which the growing single crystal is subjected is homogenous and symmetric, and it is possible to grow high quality crystals that are as free as possible from edge defects.

Figure 9:
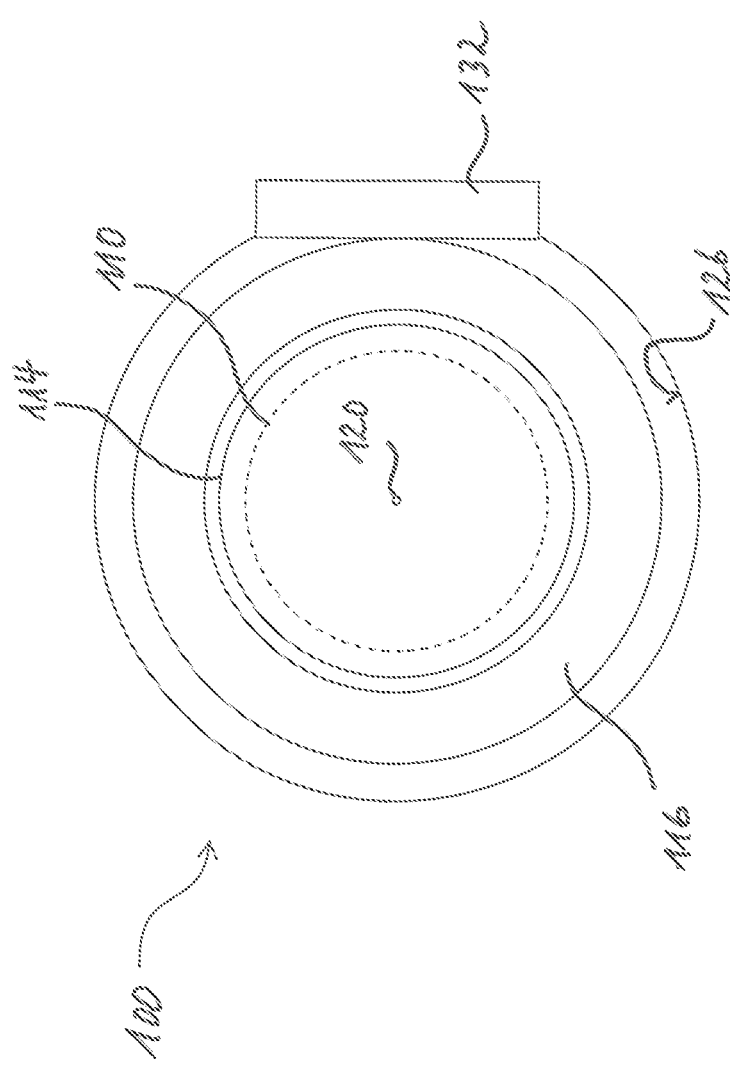
FIG. 9 is a schematic top view of a sublimation system according to a further example.
Figure 10:
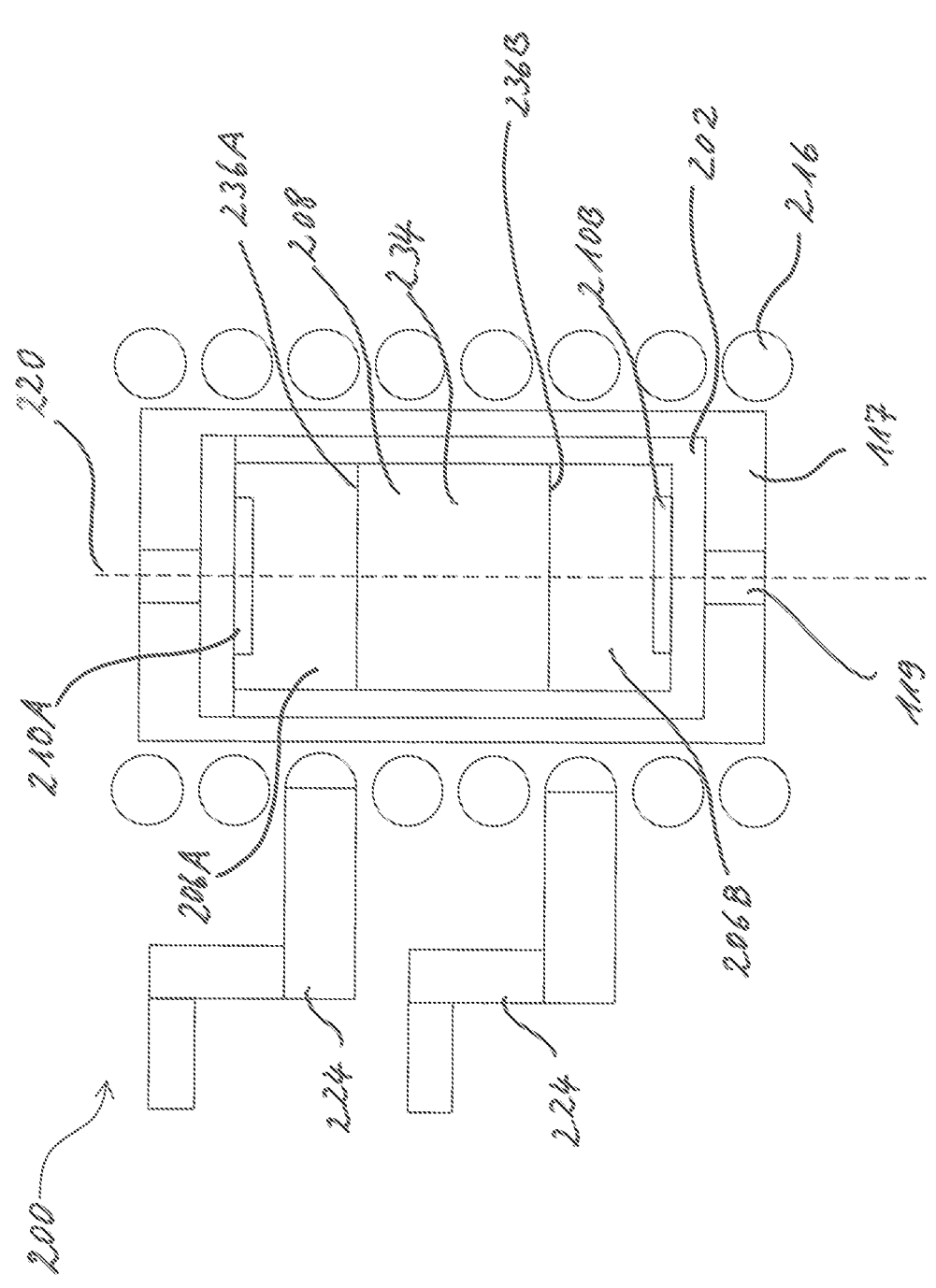
FIG. 10 is a schematic sectional side view of a sublimation system according to a further example.

FIG. 9 shows in a top view a sublimation system 100 according to a further advantageous example. As shown in this Figure, the asymmetry of the temperature field may also be caused by an asymmetric shielding 126 and a metallic holder 132 of the shielding 126. The holder 132 may e. g. extend into the gap between the coil 116 and the shielding 126. The reactor 114 comprises the crucible and the thermal insulation unit explained above.

Thus, in operation the heating coil 116 generates a non-uniform temperature field, which is compensated by the discontinuity (or discontinuities) provided at the thermal insulation unit according to the present disclosure. Thus, the growing single crystal experiences a uniform temperature field which leads to a high quality crystal boule with only few edge defects.

Now turning to FIG. 7, the principles of the present disclosure may further be applied to a sublimation system 200, which is operable to grow two single crystal boules simultaneously. To this end, the crucible 202 comprises a first seed crystal 210A and a second seed crystal 210B. FIG. 7 shows the example analogous to the arrangement shown in FIG. 4. However, it is clear that any of the other possibilities of how an asymmetric temperature field could occur, may also be present in a sublimation system 200 for simultaneously growing more the one single crystal boule as for instance described in the European patent EP 2 664 695 B1.

In particular, FIG. 7 shows a schematic cross sectional view of a physical vapor transport (PVT) growth system 200 for simultaneously growing two SiC bulk crystals. The system 200 comprises a crucible 202 which contains a central source material compartment 234 containing SiC powder 208 as the SiC source material. The source material 208 may also be densified or provided partly or completely as a solid material in order to enhance the density of the source material 208.

The two seed crystals 210A and 210B are arranged in growth regions 206A and 206B. Each of the growth regions 206A and 206B is separated from the powderous SiC source material 208 by means of a gas permeable porous barrier 236A, 236B. Thus, it is ensured that only gaseous Si and C containing components enter the growth regions 206A and 206B.

A heating coil 216 provides the necessary temperature field. The asymmetry of the temperature field is for instance caused by electrical contacts 224 in the vicinity of the crystal growth regions 206 A, 206B.

In order to compensate the asymmetry of the temperature field that would otherwise be generated by the heating means 116, the thermal insulation unit 117 provides a counteracting discontinuity (or more than one discontinuities) in line with the examples explained above. Thus, the growing single crystal experiences a uniform temperature field which leads to a high quality crystal boule with only few edge defects.

In summary, the present disclosure is based on the finding that despite the use of a growth system that produces an inhomogeneous temperature field, it is possible to grow high quality crystals that are as free as possible from edge defects if a special isolation design is used.

Since an ideally homogeneous isolation as provided according to the state of the art in combination with a growth system with an inhomogeneous temperature field is obviously not sufficient to obtain the desired crystal quality, the approach presented in the present disclosure is to balance the overall inhomogeneity by using a locally inhomogeneous isolation for growing SiC single crystals in an inhomogeneous growth system and to generate a homogeneous temperature field in the region of the growing crystal. For this purpose, several conditions have to be fulfilled.

The solution to the technical problem of growing crystals free of edge defects lies, on the one hand, in the use of a growth system that causes at least one inhomogeneous and radially asymmetric heat input into the growth crucible.

Inhomogeneous, asymmetric heat coupling can for instance be caused by the following features of the growth system:

- Non-equidistant spacing of coil turns of the heating system due to an offset of the windings
- Non-equidistant spacing of the coil turns due to non-uniform construction of the turns
- Inlet and outlet to the coil/resistance heater in the area of the susceptor and/or the growth crucible
- Winding ends of the coil (in the area of the susceptor and/or the growth crucible)
- (Metallic) brackets or struts directly on the coil or between the turns of the coil, which distort the induction
- Use of an asymmetrical shielding of the electromagnetic field The solution to the technical problem of growing edge defect free crystals on the other hand lies in the use of inhomogeneous isolation in combination with above described growth equipment to produce in sum a homogeneous field in the crystal growth space.

The isolation may have the following characteristics, which result in inhomogeneity or discontinuity:

- Wound, stitched, cramped, and/or tucked web of needled carbon fibers with overlap
- Wound, stitched, tucked web cramped, and/or of needled carbon fibers without overlap with a straight butt
- Wound, stitched, cramped, and/or tucked web of needled carbon fibers with a beveled joint
- Multi-part design having at least two sheets of needled carbon fibers with a design as described above with butt joints or overlapping ends and/or stitching at multiple positions

Single or multi-part design having a sewing also on the side opposite the joint or overlap Sewing in several positions, sewing on four sides at an angle of 90°.

Combination of needled carbon fibers with compacted short fibers

Single or multi-piece design made of slotted cylinders of compacted short fibers Cylinders made of compacted short fibers with discontinuities and/or joints due to seams and/or glued joints Use of stepped or locally thinned cylinders made of needled carbon fibers and/or compacted short fibers Piecing of cylinders of needled carbon fibers and/or compacted short fibers with discontinuity along and/or across the radial symmetric axis of the growth cylinder Insertion of defined gaps between insulation cylinders, base, and/or lid for a control of the local temperature field The inhomogeneity or discontinuity in the insulation leads to a local change in the insulation properties. Thus, at the point without an overlapping joint, the insulation effect can be reduced by interrupting the ring currents (ring currents can also be generated slightly in the insulation material by the coupling induction field). In this way, defects such as carbon inclusions and/or carbon particles as described above can be avoided, since local hotspots generated by the system due to its design can be compensated.

By combining the asymmetric isolation and the asymmetric growth system according to the present disclosure, a homogeneous field is generated in the growth chamber, so that a homogeneous and edge defect free SiC single crystal can be grown.

The growth rate, measured at two points on the diameter of the substrate to be prepared from the crystal, can deviate by at least 0.1 µm/h, but must not deviate by more than 10 µm/h, preferably by 7 µm/h. This condition leads to uniform growth in the edge region of the entire crystal circumference and to the suppression of edge defects.

The targeted introduction of asymmetric insulation into an asymmetric growth system results in combination in a homogeneous temperature field in the growth chamber. As a result, a homogeneous and essentially edge defect-free SiC single crystal can be grown.

According to the present disclosure, a method is provided for the production of at least one SiC volume single crystal by means of sublimation growth, wherein prior to the start of growth in a crystal growth region of a growth crucible, partly formed from graphite, an SiC seed crystal, fixed on a holding device, is arranged and powdered or (partially) compacted SiC source material is introduced into an SiC supply region of the growth crucible and the crucible is enclosed with insulation. Thereby, during the growth at a growth temperature of up to 2400° C., generated by a heat coupling of an induction coil or resistance heating, and a growth pressure between 0.1 mbar and 100 mbar, an SiC growth gas phase is generated there by means of sublimation of the SiC source material and by means of transport of the sublimated gaseous components into the crystal growth region, in which SiC growth gas phase an SiC volume single crystal grows on the SiC seed crystal by means of deposition from the SiC growth gas phase.

The equipment used for sublimation cultivation has inhomogeneities and asymmetries due to its design. At the same time, an isolation with inhomogeneities and/or discontinuities is used.

By combining the design inhomogeneities of the growth system and the inhomogeneities or discontinuities of the insulation, a homogeneous temperature field can be generated in the reactor, especially in the crystal growth region. This is achieved by orienting and aligning the insulation inhomogeneities with respect to the plant asymmetries, which is determined in preliminary experimental tests. Similarly, if there are multiple plant asymmetries, inhomogeneous isolations can be balanced with multiple inhomogeneities.

The resulting homogeneous temperature field in the crystal growth region, which acts on the growing crystal, allows the production of crystals that are almost free of edge defects.

Furthermore, the growth rate, measured at two points on the diameter of the substrate diameter to be prepared, can differ by at least 0.1 µm/h, but may only deviate by a maximum of 10 µm/h, preferably by 7 µm/h. The maximum and minimum length differences between the crystal surface and the crystal back side on the crystal's outer diameter may differ by 10% or less from the mean crystal length measured from the outer diameter of the crystal. Preferably, the maximum and minimum length differences between the crystal surface and the crystal back side on the crystal's outer diameter may differ by 5% from the mean crystal length measured from the outer diameter of the crystal.

The average length difference between the crystal surface and the crystal backside measured on the diameter corresponding to the finished wafer should be around at least 1 mm lower but no more than 6 mm lower than the maximum difference in length between crystal surface and crystal back side.

The differences in length may be measured at the crystal edge, but also on a diameter corresponding to the diameter of the finished wafer.

The principles of the present disclosure are usable to grow SiC single crystal boules for producing substrates with a crystal modification of 4H, 6H, 15R, 3C, preferably 4H. The grown single crystal boules may have a crystal diameter of approx. 150 mm or more, preferably of approx. 200 mm.

| REFERENCE NUMERALS | |
| --- | --- |
| Reference Numeral | Description |
| 100; 200 | sublimation system; PVT system |
| 102; 202 | crucible |
| 104 | SiC supply region; source material compartment |
| 106; 206A, 206B | crystal growth region |
| 108; 208 | source material |
| 110; 210A, 210B | seed crystal |
| 112 | crucible lid |
| 114 | container; reactor |
| 115 | deformed region |
| 116; 216 | inductive or resistive heating coil; heating means |
| 117 | thermal insulation unit |
| 119 | transparent window |
| 120; 220 | central axis |
| 122 | displaced region |
| 124; 224 | electrical contact |
| 126 | shielding |
| 132 | holder |
| 234 | source material compartment |
| 236A, 236B | barrier |
| 300 | body |
| 302 | joint |
| 304 | stitching |
| 306 | cramp |
| 308 | slot |
| 310 | inner surface |
| 312 | outer surface |
| 314 | bevel |
| 316 | bevel |

-continued

| REFERENCE NUMERALS | |
| --- | --- |
| Reference Numeral | Description |
| 318 | joint region |
| 320 | slanted supporting surface |
| 322 | slanted supporting surface |
| 324 | wall of the body |
| 800 | PVT system |
| 802 | crucible |
| 804 | SiC supply region |
| 806 | crystal growth region |
| 808 | source material |
| 810 | seed crystal |
| 812 | crucible lid |
| 814 | container; reactor |
| 816 | inductive heating coil |

The invention claimed is:

1. Sublimation system for growing at least one single crystal of a semiconductor material by means of a sublimation growing process, the sublimation system (100) comprising:

a crucible (102) having a longitudinal axis (120) and comprising a fixing means for at least one seed crystal (110) and at least one source material compartment (104) for containing a source material (108);

a heating system being formed to generate an irregular temperature field around a circumference of the crucible (102) and/or along the longitudinal axis of the crucible (102); and a thermal insulation unit (117) at least partly surrounding the crucible (102);

wherein the thermal insulation unit (117) has a radially and/or axially asymmetric form to compensate the irregular temperature field, wherein the heating system is formed with an asymmetry that causes an asymmetry in the generated temperature field, wherein the thermal insulation unit (117) is structured with one or more discontinuities in a longitudinal direction along the longitudinal axis (120), and wherein each discontinuity is positioned at a radial position that causes the discontinuity of the thermal insulation unit (117) to compensate the asymmetry of the heating system.

2. Sublimation system according to claim 1, wherein the heating system comprises an induction coil (116) operable to generate an electro-magnetic field and/or a resistive heating coil (116), at least partly surrounding the crucible (102).

3. Sublimation system according to claim 1, wherein the thermal insulation unit (117) comprises a needled carbon felt and/or densified carbon short fibers.

4. Sublimation system according to claim 1, wherein the thermal insulation unit (117) comprises a bendable sheet of carbon material, which is wrapped around the crucible (102) and comprises a stitching (304), at least one cramp (306), and/or an overlap region.

5. Sublimation system according to claim 1, wherein the heating system comprises a metallic strut member.

6. Sublimation system according to claim 2, wherein the coil (116) has a deformed cross-section in at least one of its windings, and/or wherein the coil (116) has at least one winding, which is arranged to have a different distance from its neighboring windings.

7. Sublimation system according to claim 2, wherein the coil (116) comprises at least one electrical contact (124), which is arranged at an axial position adjacent to the crucible (102).

8. Sublimation system according to claim 1, wherein the thermal insulation unit (117) has a cylindrical shape with a varying wall thickness around its circumference.

9. Sublimation system according to claim 1, wherein the thermal insulation unit (117) comprises one or more slots (308) forming at least one gap or a trench.

10. Sublimation system according to claim 1, wherein the thermal insulation unit (117) is formed by a plurality of separate parts which are assembled to have junctions extending in a radial and/or an axial direction.

11. Sublimation system according to claim 1, wherein the thermal insulation unit (117) is formed by a sheet of insulating material, which is arranged around the crucible forming an abutting joint, a slanted abutting joint, and/or an overlapping joint.

12. Method of growing at least one single crystal of a semiconductor material by means of a sublimation growing process, the method comprising:

providing a crucible (102) having a longitudinal axis (120), fixing at least one seed crystal (110) at a fixing means of the crucible, and filling a source material (108) into at least one source material compartment (104);

generating, by means of a heating system, an irregular temperature field around a circumference of the crucible (102) and/or along the longitudinal axis of the crucible (102);

wherein a thermal insulation unit (117) is provided which is at least partly surrounding the crucible (102), and which has a radially and/or axially asymmetric form to compensate the irregular temperature field, wherein the heating system is formed with an asymmetry that causes an asymmetry in the generated temperature field, wherein the thermal insulation unit (117) is structured with one or more discontinuities in a longitudinal direction along the longitudinal axis (120), and wherein each discontinuity is positioned at a radial position that causes the discontinuity of the thermal insulation unit (117) to compensate the asymmetry of the heating system.

13. Method according to claim 12, wherein the temperature field acting on the growing single crystal causes a growth rate measured around a defined circumference of the single crystal to differ for any two points along the circumference by at least 0.1 µm/h and not more than 10 µm/h, preferably by 0.7 µm/h.

14. Method according to claim 12, wherein the temperature field acting on the growing single crystal causes the finally grown single crystal to have a distribution of length values between a back surface of the single crystal and a top surface of the single crystal, measured along a defined circumference of the single crystal, which differ from a mean value by not more than 10%, preferably by not more than 5%.

15. Method according to claim 13, wherein the defined circumference is an outer circumference of the finally grown single crystal, or wherein the defined circumference is a radial distance from the center of the finally grown single crystal, which corresponds to a diameter of a substrate produced from the finally grown single crystal.

* * * * *